United States Patent [19]

Garnett et al.

[11] Patent Number: 5,468,965

[45] Date of Patent: Nov. 21, 1995

[54] CIRCULAR, CONFINED DISTRIBUTION FOR CHARGED PARTICLE BEAMS

[75] Inventors: Robert W. Garnett, Los Alamos, N.M.; M. Christian Dobelbower, Toledo, Ohio

[73] Assignee: The Regents of the University of California, Office of Technology Transfer, Alameda, Calif.

[21] Appl. No.: 303,963

[22] Filed: Sep. 9, 1994

[51] Int. Cl.$^6$ ............................................. H01J 37/14
[52] U.S. Cl. ................................. 250/396 ML; 250/358
[58] Field of Search ........................... 250/396 ML, 398, 250/492.2, 492.21

[56] References Cited

U.S. PATENT DOCUMENTS

| | | | |
|---|---|---|---|
| 4,429,229 | 1/1984 | Gluckstern | 250/396 ML |
| 4,736,106 | 4/1988 | Kasky | 250/396 |
| 4,767,930 | 8/1988 | Stieber et al. | 250/396 ML |
| 4,823,013 | 4/1989 | Van Der Mast | 250/396 ML |
| 4,853,545 | 8/1989 | Rose | 250/396 ML |
| 4,962,317 | 10/1990 | Jason | 250/396 |

OTHER PUBLICATIONS

E. Kashy et al., "A Method for the Uniform Charged Particle Irradiation of Large Targets," B26 Nuclear Instruments and Methods in Physics Research, pp. 610–613 (1987), North–Holland, Amsterdam.

B. Sherrill et al., "Use of Multipole Magnetic Fields for Making Uniform Irradiations," B40/41 Nuclear Instruments and Methods in Physics Research, pp. 1004–1007 (1989), North–Holland, Amsterdam.

*Primary Examiner*—Bruce C. Anderson
*Attorney, Agent, or Firm*—Ray G. Wilson

[57] ABSTRACT

A charged particle beam line is formed with magnetic optics that manipulate the charged particle beam to form the beam having a generally rectangular configuration to a circular beam cross-section having a uniform particle distribution at a predetermined location. First magnetic optics form a charged particle beam to a generally uniform particle distribution over a square planar area at a known first location. Second magnetic optics receive the charged particle beam with the generally square configuration and affect the charged particle beam to output the charged particle beam with a phase-space distribution effective to fold corner portions of the beam toward the core region of the beam. The beam forms a circular configuration having a generally uniform spatial particle distribution over a target area at a predetermined second location.

5 Claims, 6 Drawing Sheets

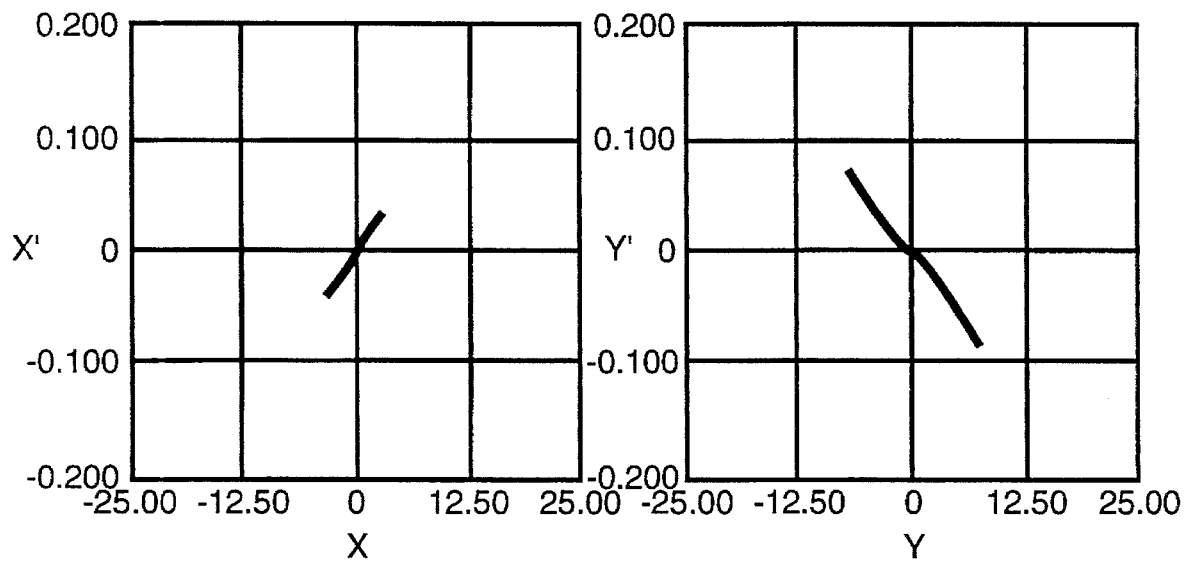
Fig. 2A  Fig. 2B
Fig. 2D
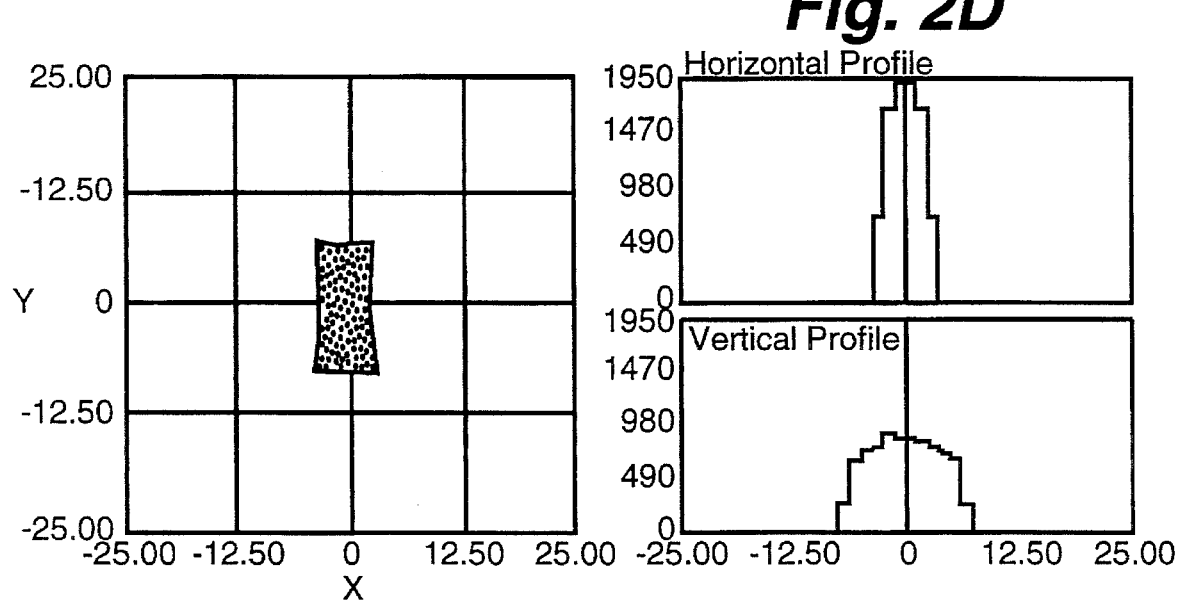
Fig. 2C  Fig. 2E

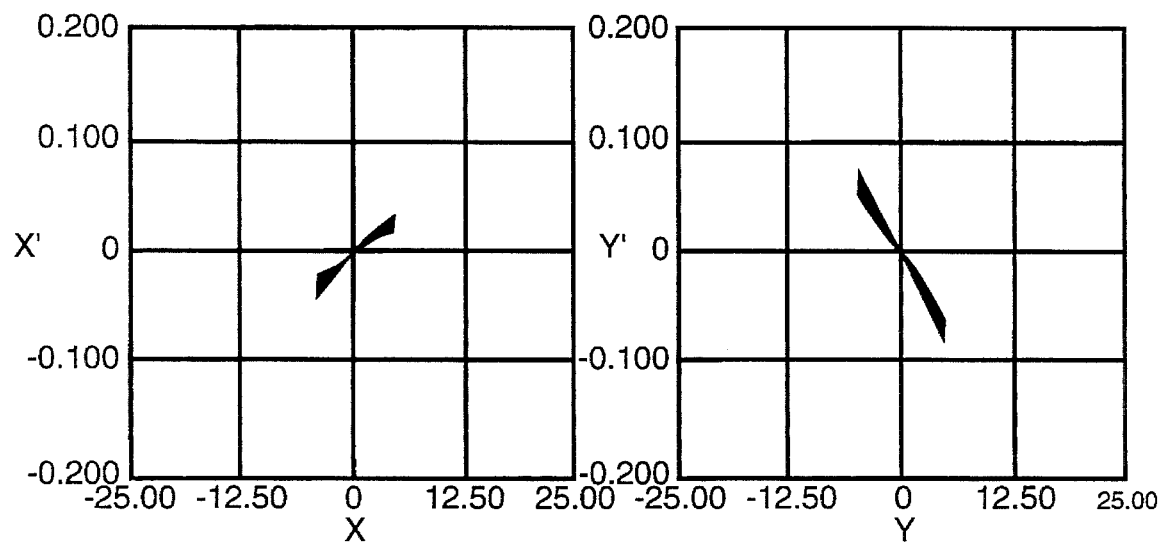
Fig. 3A          Fig. 3B
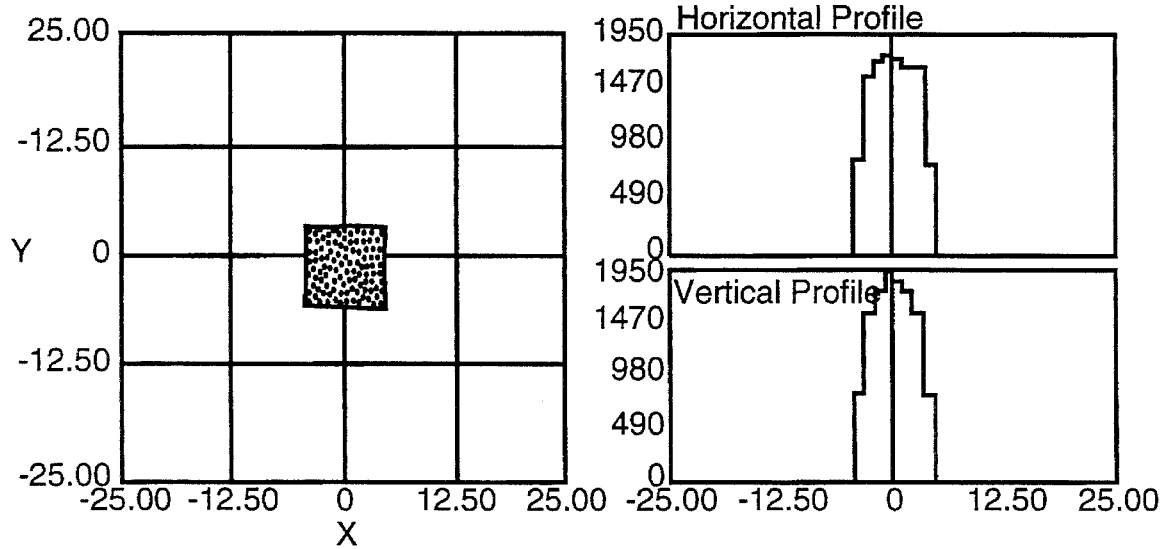
Fig. 3C          Fig. 3E
Fig. 3D

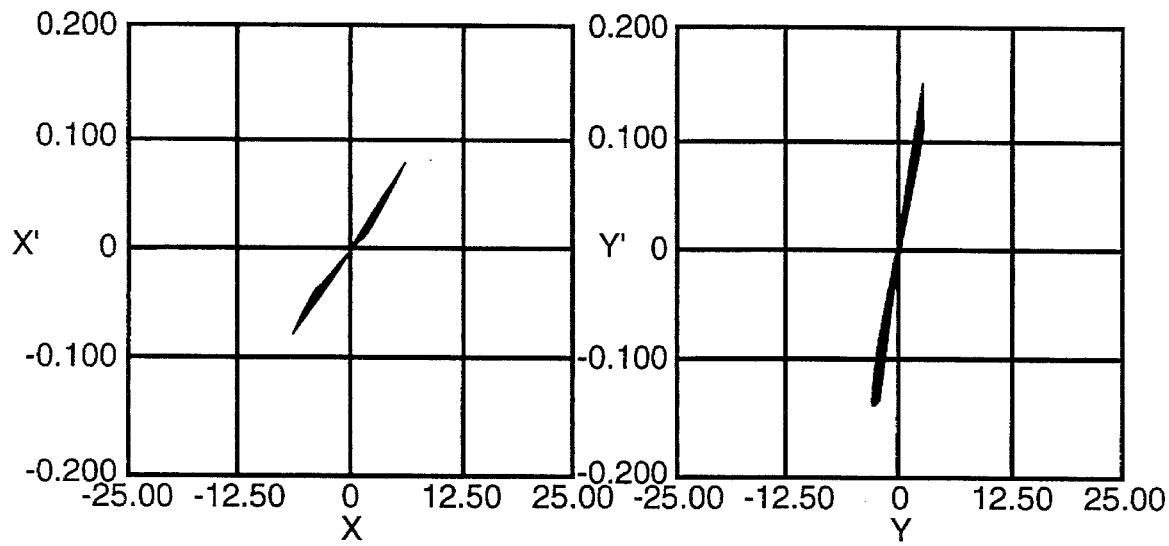
Fig. 5A  Fig. 5B
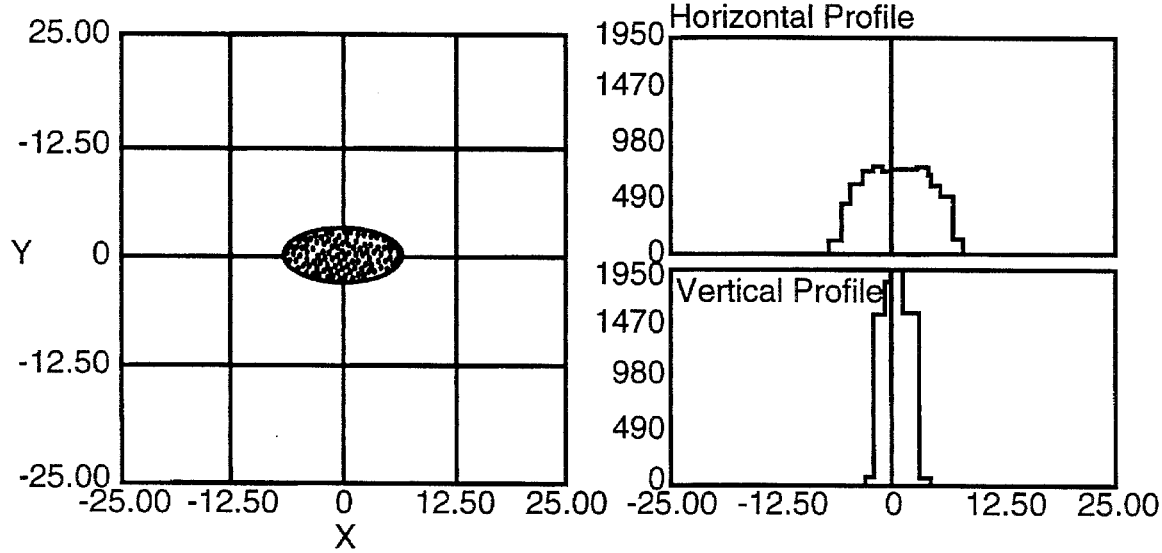
Fig. 5C  Fig. 5E
Fig. 5D

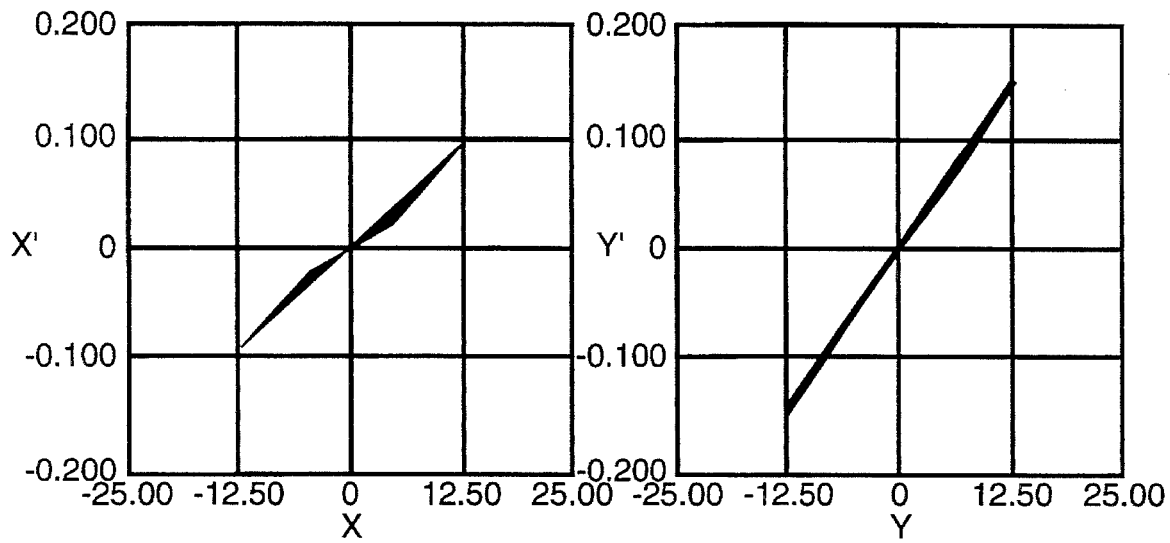
Fig. 6A          Fig. 6B
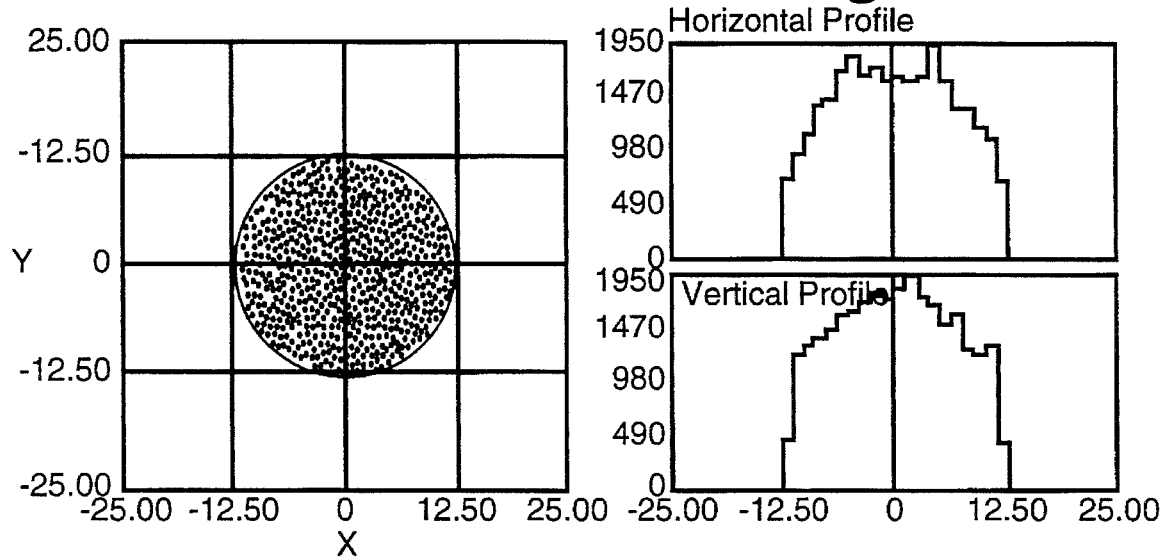
Fig. 6C          Fig. 6E
Fig. 6D

CIRCULAR, CONFINED DISTRIBUTION FOR CHARGED PARTICLE BEAMS

This invention was made with government support under Contract No. W-7405-ENG-36 awarded by the U.S. Department of Energy. The government has certain rights in the invention.

BACKGROUND OF THE INVENTION

This invention relates to accelerator beam optics and, more particularly, to shaping charged particle beams for confining the beam energy to a circular distribution over a selected target area.

For radiation therapy, waste transmutation, tritium production, etc., it is necessary to generate a charged particle beam having a uniform spatial distribution. There are several methods used to make a uniform irradiation. Some of these methods scan a small beam spot over the extent of the target. Other methods spread the beam by multiple scattering in an absorber material and, by tailoring the absorber shape and thickness, smooth the non-uniform beam distribution.

More recently, a system of multipole magnets has been used to spread a small, non-uniform (e.g., Gaussian or triangular distribution) beam and transform it to a nearly spatially uniform rectangular distribution. U.S. Pat. Nos. 4,736,106 and 4,962,317 teach the use of octupole magnets to spread a charged particle beam in two dimensions to produce a beam having a highly uniform particle distribution over most of a rectangular target located at a predetermined distance from a beam source. There are, however, many instances where circular targets are required, and the use of a rectangular beam would result in the loss of substantial beam energy outside of the target area.

Accordingly, the object of the present invention is to provide a circular charged particle beam with a substantially uniform spatial particle distribution at a predetermined target location.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the apparatus of this invention may comprise magnetic optics for manipulating a charged particle beam to form the beam to a circular beam having a generally uniform particle distribution at a predetermined location. First magnetic optics form a charged particle beam to a generally uniform particle distribution over a rectangular planar area at a known first location. Second magnetic optics receive the charged particle beam having a generally rectangular configuration and affect the charged particle beam to output the charged particle beam with a phase-space distribution effective to fold corner portions of the beam toward a core region of the beam. The beam forms a circular configuration having a generally uniform spatial particle distribution over a target plane at a predetermined second location.

In another characterization of the present invention, a charged particle beam is manipulated to form the beam to a circular beam having a generally uniform particle distribution over a target at a predetermined location. The charged particle beam is first formed to a generally rectangular configuration at a known first location. The beam having the generally rectangular distribution is magnetically affected to have a phase-space distribution effective to fold corner portions of the beam toward a core region of the beam. The beam then forms to a circular configuration having a generally uniform spatial particle distribution over a target plane at the predetermined location.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings:

FIGS. 2A–E graphically depict the beam parameters after the beam is formed to a generally rectangular configuration.

FIGS. 3A–E graphically depict the beam parameters after being affected toward a circular pattern.

FIGS. 4A–E graphically depict the beam parameters just prior to expanding toward a target.

FIGS. 5A–E graphically depict the beam parameters after some drift along the expansion drift space.

FIGS. 6A–E graphically depict the beam parameters after the beam has formed to a circular configuration with generally uniform particle distribution at a predetermined target location.

DETAILED DESCRIPTION OF THE INVENTION

The output beam from a charged particle accelerator does not generally have a uniform particle distribution over the beam. For example, the output distribution from a radio frequency quadrupole (RFQ) accelerator is approximately Gaussian or triangular. As shown in U.S. Pat. Nos. 4,736,106 and 4,962,317, multipole magnets, such as octupole (8 magnetic poles), duodecapole (12 magnetic poles), and the like, act on a charged particle beam to affect the functional form of the particle distribution in the beam. Lower order magnets, such as quadrupoles (4 magnetic poles), can affect the size of the beam, i.e., for beam focusing or expansion, but cannot affect the particle distribution in the beam.

The function describing an initial beam distribution, $I_o(x)$, along the x-axis can be expanded in a Taylor series:

$$I_o(x) = a + bx + cx^2 + dx^3 + ...$$

Likewise, the optical system (single or multiple magnets) can be described by a multipole expansion, $f(x)$. The condition for having a uniform distribution requires the ratio of the final beam distribution, $I(x)$, and the derivative of the function describing the optics of the system, $f'(x)$, to be a constant. This is done by adjusting the optics. For a Gaussian distribution, for example, the first term to cancel in the expansion is of order $x^2$ so that the term in the optics multipole expansion must be proportional to $x^3$, i.e., the octupole term. In general the multipole of order n must be adjusted to match the n-1 coefficient of the Taylor series expansion of the initial beam distribution. Once the initial beam distribution is known, a solution is generally found through simulations where the beam distribution is predicted for a variety of magnet strengths and the magnet strengths are varied until a desired distribution is obtained.

Figure 1:
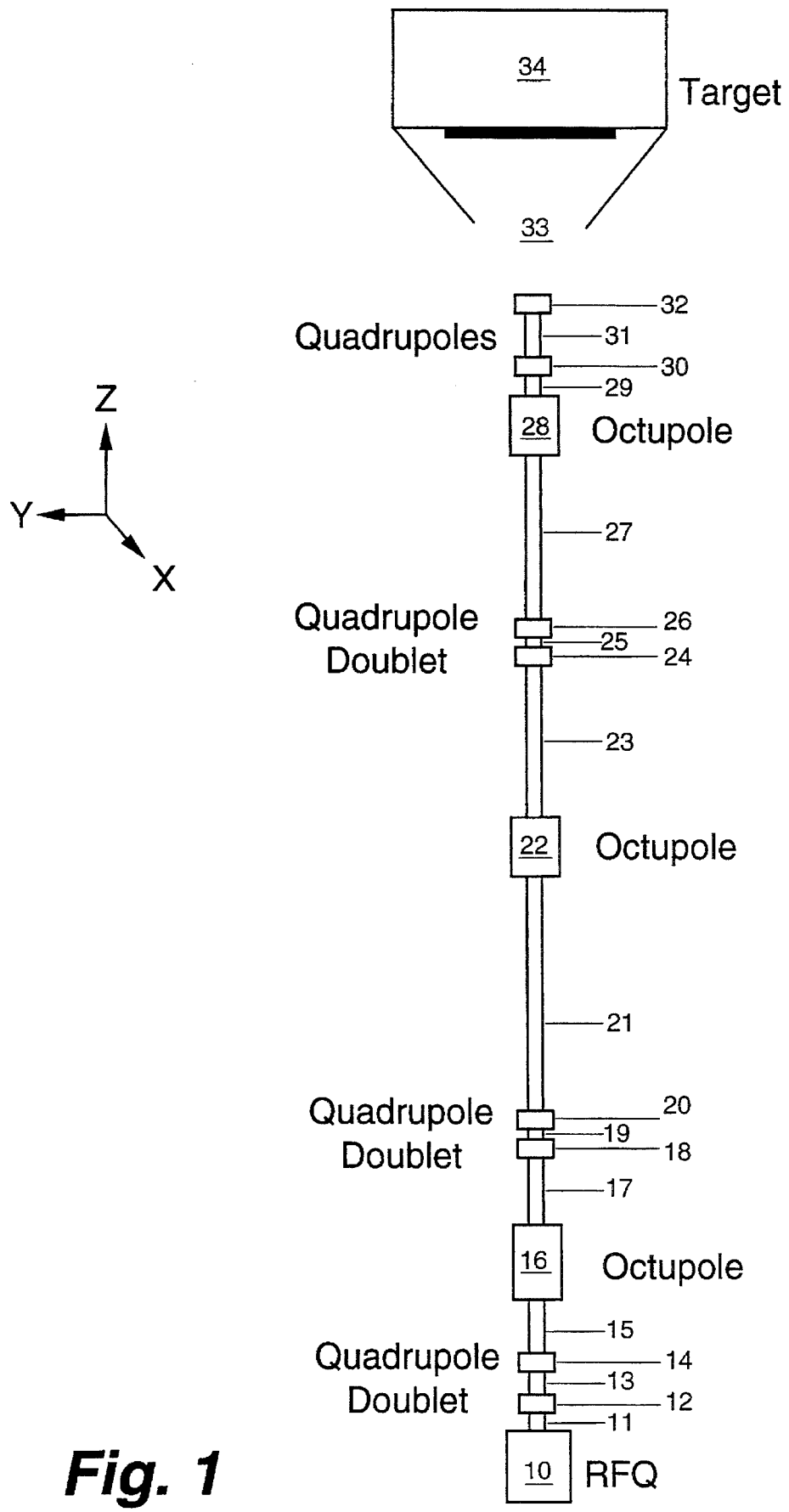
FIG. 1 is a schematic illustration of beam line expander according to one embodiment of the present invention.
Figure 4D:
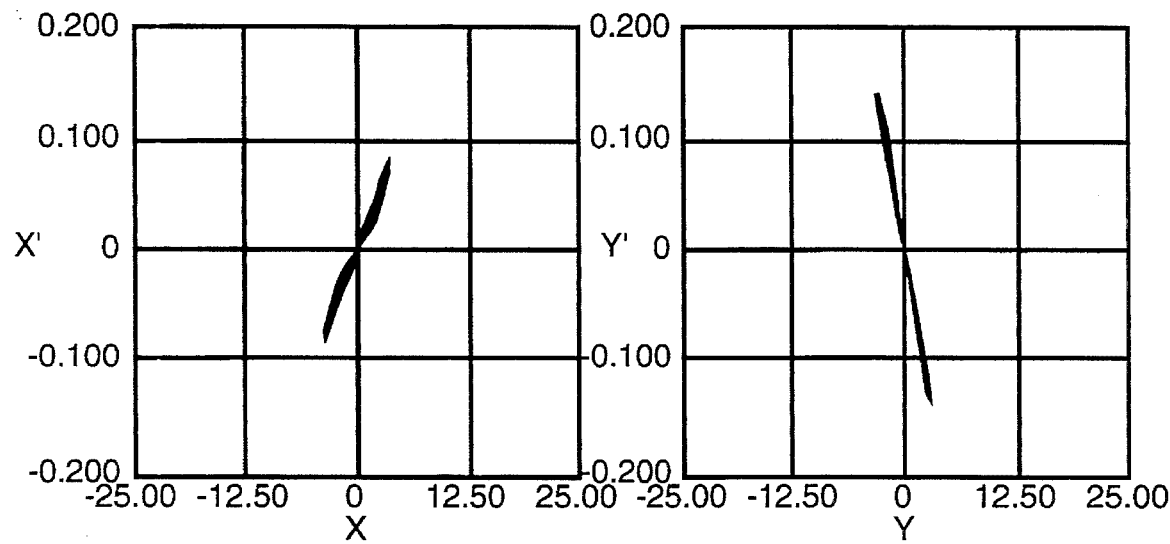
Figure 4D:
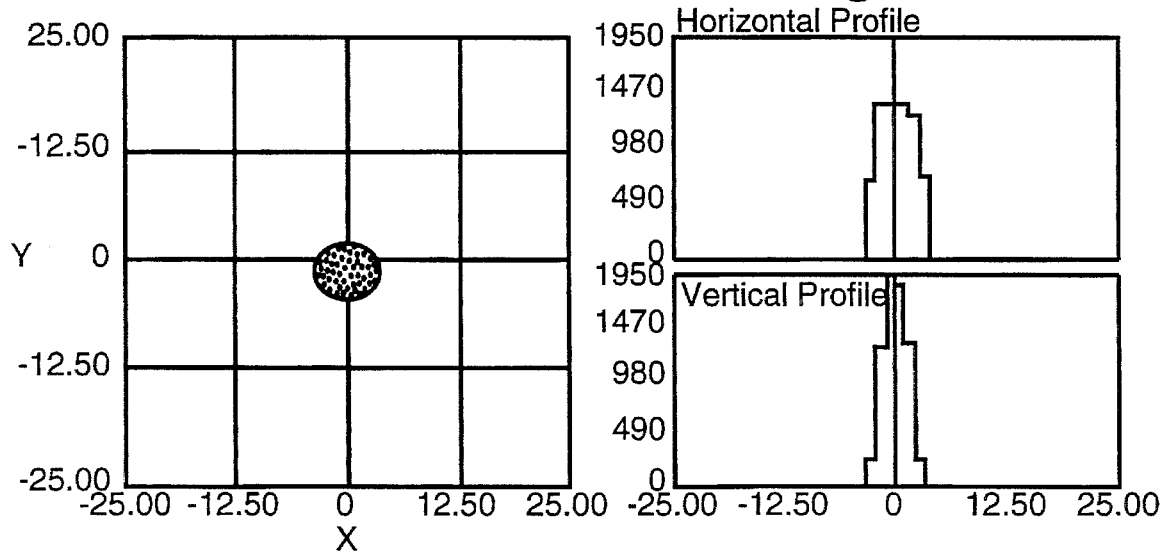

FIG. 1 is a schematic illustration of a beam line according to one embodiment of the present invention. As indicated in FIG. 1, the beam propagates along the z-direction and the particle distribution is determined in the x-y plane at locations along the z-direction A beam accelerator .10, e.g., a RFQ, outputs a charged particle beam with a Gaussian or triangular particle distribution through a first drift distance 11 to a first set of quadrupoles 12, 14, separated by a short drift distance 13. Quadrupoles 12, 14 focus the beam to a waist in the y-dimension for output along drift distance 15 to octupole 16. Octupole 16 affects the phase-space of the beam. The beam is then output through drift distance 17 to a second set of quadrupoles 18, 20 separated by drift distance 19 and focused to a waist in the x-direction. The beam is then output through drift distance 21 to a second octupole 22. Octupole 22 affects the yy' phase-space of the beam. If a uniform, rectangular target distribution was desired, as shown in the '106 and '317 patents, a third set of quadrupoles would be used, with drift, to form the beam size to the desired spot at the target.

In accordance with the present invention, the beam is output from octupole 22 through drift distance 23, quadrupole doublet 24, 26 connected by drift distance 25, and drift tube 27 and input to octupole 28. The beam arriving at octupole 28 has a generally rectangular configuration. Octupole 28 is rotated 45° relative to octupoles 16, 22, i.e., poles in octupole 28 are now in alignment with opposite poles in octupoles 16, 22 in a direction parallel to the beam axis. The strength of octupole 28 is selected to alter the beam phase-space to fold the particles at the corners of the rectangle towards the center of the distribution. Quadrupoles 30, 32, with drift distances 29, 31, 33, allow sufficient time for the particles to move towards the distribution center and to obtain the desired beam size at a predetermined location of target 34.

The design of an exemplary beam line according to the present invention was done using the PARMILA software (available from the Los Alamos National Laboratory, Los Alamos, N. Mex.), which modeled the effects of the magnetic fields of the quadrupoles and octupoles, along with space-charge forces, on the beam. Simulations were done by transporting the RFQ output macroparticles (9049 macroparticles) along the entire beam line. The beam output from RFQ 10 was a 60 mA, cw, 2.5 MeV beam. The beam line shown in FIG. 1 is compact, having an overall length of 6.3 m from RFQ 10, and produces a beam size at target 34 of 25 cm diameter.

The beam line component design values are shown in Table A and produced a generally uniform particle distribution over a circular configuration in simulations using PARMILA, as shown in Table B. As used herein, a generally uniform particle distribution means a particle distribution having a peak-to-average ratio of less than about 1.5 For the circular distribution, the maximum beam radius was first determined. The area occupied by the beam was then subdivided into 10 concentric bands in 10 steps of equal radius. The

TABLE A

| Beam Line Component Design Parameters | | | | | |
|---|---|---|---|---|---|
| Element No. | Element Type | Length (cm) | Aperture Radius (cm) | Pole-Tip Field (T) | Gradient |
| 11 | Drift | 10.0 | 3.0 | | |
| 12 | F-Quad | 10.0 | 3.0 | 0.765 | 25.5 T/m |
| 13 | Drift | 10.0 | 3.0 | | |
| 14 | D-Quad | 10.0 | 3.0 | 0.540 | 18.0 T/m |
| 15 | Drift | 28.5 | 3.0 | | |
| 16 | Octupole | 30.0 | 3.0 | 0.419 | 15,500 T/m$^3$ |
| 17 | Drift | 35.0 | 6.0 | | |
| 18 | D-Quad | 10.0 | 6.0 | 0.510 | 8.5 T/m |
| 19 | Drift | 8.0 | 6.0 | | |
| 20 | F-Quad | 10.0 | 6.0 | 0.510 | 8.5 T/m |
| 21 | Drift | 90.0 | 7.0 | | |
| 22 | Octupole | 20.0 | 7.0 | 0.077 | 225 T/m$^3$ |
| 23 | Drift | 60.0 | 10.0 | | |
| 24 | F-Quad | 20.0 | 10.0 | 0.530 | 5.3 T/m |
| 25 | Drift | 13.0 | 10.0 | | |
| 26 | D-Quad | 20.0 | 10.0 | 0.610 | 6.1 T/m |
| 27 | Drift | 20.0 | 10.0 | | |
| 28 | Octupole | 25.0 | 10.0 | 0.090 | −90.0 T/m |
| 29 | Drift | 15.0 | 10.0 | | |
| 30 | F-Quad | 20.0 | 10.0 | 0.169 | 1.69 T/m |
| 31 | Drift | 45.0 | 10.0 | | |
| 32 | D-Quad | 20.0 | 10.0 | 0.420 | 4.20 T/m |
| 33 | Drift | 108.0 | | | | number of particles per unit area was then calculated for each band. The peak-to-average ratio provides a measure of the distribution of heating over the target area, and the standard deviation provides a measure of the beam uniformity. Thus, a circular particle beam having a generally uniform particle distribution is predicted by the PARMILA simulation. Optimization of the beam line design will likely result in a more uniform beam with a lower peak-to-average particle distribution ratio.

TABLE B

| Beam Uniformity Analysis | |
|---|---|
| Beam Radius (cm) | No. of Particles/cm$^2$ |
| 1.2481 | 17.778 |
| 2.4961 | 17.574 |
| 3.7442 | 16.348 |
| 4.9923 | 16.844 |
| 6.2404 | 16.212 |
| 7.4884 | 16.218 |
| 8.7365 | 16.411 |
| 9.9846 | 18.146 |
| 11.233 | 24.414 |
| 12.481 | 18.639 |
| | Ave. = 17.858 |
| | Standard Deviation = 2.3358 no./cm$^2$ |
| | Peak-to-Average = 1.3671 |

FIGS. 2A–E, 3A–E, 4A–E, 5A–E, and 6A–E show the evolution of the beam through drift expander 33, starting at the end of drift 23 after octupole 22. In all of the figures, the A figure shows the beam phase-space in the x-direction, i.e., particle velocity (x') as a function of x; the B figure shows the beam phase-space in the y-direction; the C figure shows beam particle distribution in the x-y plane at the specified location along the z-axis; the D figure shows the particle distribution profile in the horizontal (x) direction; and the E figure shows the particle distribution profile in the vertical (y) direction. FIGS. 2A–E show the beam parameters after octupole 22 and drift 23. The beam is expanded to a generally rectangular configuration. FIGS. 3A–E depict the beam parameters after octupole 28 and drift 29. The beam corners have begun to "round" as particles in the beam corners are directed to the beam center. At the end of the final defocus quadrupole 32, the beam is generally rounded, as shown in FIGS. 4A–E.

In the final drift space 32, the beam is expanding and the particle phase-space distribution affected by octupole 28 is forming the beam to the desired circular configuration. FIGS. 5A–E show the beam parameters after a drift of 40 cm. The beam has gone through a waist in the y-direction and is now diverging in both x and y. At the target 34 location, i.e., a drift of 108 cm, the beam has reached a circular distribution with generally uniform particle distribution over the planar circular area. A target placed at this location will intersect the beam with the desired characteristics.

The exemplary beam design set forth above uses only octupoles as the nonlinear magnetic optics for affecting the beam phase-space parameters. As noted, other multipole magnets might be used to manipulate a rectangular particle beam configuration to a circular configuration, i.e., to fold the particles at the corners of the rectangle in toward the center of the beam so that a circular configuration is developed.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. Magnetic optics for manipulating a charged particle beam to form said beam to a circular beam having a generally uniform particle distribution over a target at a predetermined location, said optics comprising:

first magnetic optics for forming a charged particle beam to a known rectangular configuration at a known first location; and second magnetic optics for receiving said charged particle beam having said rectangular configuration and affecting said charged particle beam to output said charged particle beam with a phase-space distribution effective to fold corner portions of said beam toward a core region of said beam wherein said beam forms a circular configuration having a generally uniform spatial particle distribution over a target plane at a predetermined second location.

2. Magnetic optics according to claim 1, wherein said first magnetic optics include first and second octupole magnets and said second magnetic optics include a third octupole magnet.

3. Magnetic optics according to claim 2, wherein said third octupole magnet is rotated 45° relative to said first and second octupole magnets.

4. A method for manipulating a charged particle beam to form said beam to a circular beam having a generally uniform particle distribution over a target at a predetermined location comprising the steps of:

forming said charged particle beam to a generally rectangular distribution of particles at a known first location; and magnetically affecting said beam having said generally rectangular distribution of particles to have a phase-space distribution effective to fold corner portions of said beam toward a core region of said beam wherein said beam forms a circular configuration having a generally uniform spatial particle distribution over a target plane at a predetermined second location.

5. A method according to claim 4, wherein the step of forming said charged particle beam to a generally rectangular distribution includes the step of magnetically affecting said beam with first and second octupole magnets and the step of magnetically affecting said beam to fold corner portions to said core region includes the step of magnetically affecting said beam having said generally rectangular distribution with a third octupole that is rotated 45° relative to said first and second octupoles.

* * * * *